United States Patent [19]

Yamashita et al.

[11] Patent Number: 5,705,820

[45] Date of Patent: Jan. 6, 1998

US005705820A

[54] MAGNETIC BEAM DEFLECTION SYSTEM AND METHOD

[75] Inventors: Ichiro Yamashita; Ikuo Wakamoto; Susumu Urano, all of Hiroshima; Yuichiro Kaminou, Aichi-ken, all of Japan

[73] Assignee: Mitsubishi Jukogyo Kabushiki Kaisha, Tokyo, Japan

[21] Appl. No.: 798,572

[22] Filed: Feb. 11, 1997

[30] Foreign Application Priority Data

Feb. 16, 1996 [JP] Japan .................................... 8-029418

[51] Int. Cl.$^{6}$ .................................................... H01J 37/147

[52] U.S. Cl. .............................. 250/396 ML; 250/396 R

[58] Field of Search ....................... 250/396 ML, 396 R, 250/296, 297, 298; 315/370; 335/210; 313/413, 433

[56] References Cited

U.S. PATENT DOCUMENTS 3,691,374 9/1972 Leboutet ............................ 250/396 R
3,867,635 2/1975 Brown et al. ....................... 250/396 R
4,389,572 6/1983 Hutcheon ......................... 250/396 ML

FOREIGN PATENT DOCUMENTS 2.215.011 A 8/1974 France .
2 357 989 A 2/1978 France .

OTHER PUBLICATIONS

"Focusing Of Charged Particles", vol. II, 1967 Issued by Academic Press, pp. 223–225.

*Primary Examiner*—Kiet T. Nguyen
*Attorney, Agent, or Firm*—Michael N. Meller

[57] ABSTRACT

A deflection magnetic system and method are provided to deflect an electron beam through a predetermined angle while maintaining a circular cross-section for the electron beam. A plurality of spaced magnetic fields are provided to deflect the electron beam through angles less than the total predetermined angle, but the total angle is achieved when the beam passes through the last magnetic field. Magnetic shields are provided between the spaced magnetic fields to absorb any undesired leakage magnetic flux.

12 Claims, 3 Drawing Sheets

MAGNETIC BEAM DEFLECTION SYSTEM AND METHOD

This invention relates to a method and system for obtaining a desired angular deflection of charged particles. More particularly, the present invention relates to a method and system for magnetically deflecting an electron beam through a desired angle, such as 270 degrees, in a high-energy, electron-beam generator.

BACKGROUND OF THE INVENTION

In general, an electron-beam generator using a high-frequency accelerator tube takes advantage of the convergence of the electron beam. The energy of an electron beam emitted from such high-energy, electron-beam generators varies widely, having a spread of ±5% to 10% from the central energy.

To converge an electron beam having such a wide energy range, a 270-degree deflection magnet, conventionally, having a lens effect to reduce color is used, as illustrated in FIG. 3. The deflection magnet, as illustrated in FIG. 3, is disclosed, for example, in the publication edited by A. Septier called "Focusing of Charged Particles, Volume 2," Academic Press, 1967, pp. 223–225.

The conventional deflection magnet illustrated in FIG. 3 is constructed with a single magnet 24; the entry side of the magnet for an electron beam 21 is inclined −45 degrees with respect to the central orbit 22 of the electron beam ("−" shows that the vector component of the electron beam that is parallel to the direction of the magnetic field converges, while the vector component which is perpendicular to the magnetic field diverges) and the exit side of the magnet is inclined −32.4 degrees with respect to the central orbit or trajectory 22.

If the divergence for the entering beam is zero degrees, an electron beam, after passing through a deflection magnet, focuses at 2.74× the orbit radius measured from its exit side. At this focal point, an electron beam is converged precisely by calibrating the energy-biased, focal-point displacement (chromatic aberration) and the magnetic-field, vector-biased, focal-point displacement.

FIG. 4 is a graphical waveform showing the change in an electron-beam radius and illustrates the relation between the central-orbit or trajectory coordinate axis and the radius of an electron beam. As illustrated in FIG. 4, the electron beam is focused at 2.1 m of the central-orbit coordinate axis of the electron beam. However, since the divergence angle in the x direction (perpendicular to the direction of a magnetic field of a deflection magnet) and the y direction (the direction of the magnetic field) of the electron beam is large, the beam becomes oval in cross-section after focusing.

As described above, a conventional deflection magnet maintains a circular cross-section of an electron beam after it passes through such magnet, focuses at a predetermined distance from the exit side, and irradiates the object to be irradiated. Also, because an electron and the like of unusually low energy emitted from a high-frequency accelerator tube needs to be filtered in the high-energy, electron-beam generator, a deflection magnet is also used as an energy-selecting element.

However, as illustrated in FIG. 4, the electron beam which has passed through a conventional deflection magnet expands in cross-section to an oval shape. Therefore, conventional deflection magnets are not used in electron-beam generators.

This invention intends to resolve the aforementioned problem and to provide a deflection magnet which reduces the expansion in cross-section of an electron beam.

SUMMARY OF THE INVENTION

It is accordingly an object of the present invention to provide a method and system for deflecting charged particles through a desired angle.

It is a further object of the present invention for providing a method and system for magnetically deflecting an electron beam which overcomes the difficulties of the conventional methods and systems.

In a first embodiment, the present invention includes a magnetic beam deflection system for deflecting a charged particle beam through an angle of substantially 270°. The system comprises three spaced magnets for respectively generating spaced magnetic fields between magnetic poles arranged along the desired trajectory of the charged particle beam. Each of the magnetic fields deflects a beam applied thereto through an angle less than 270°. The total angle through which the beam is deflected by the plurality of magnetic fields equals substantially 270° angle. A main coil is arranged around all of the magnets for simultaneously generating primary magnetic fields in the magnets. A first supporting coil is arranged around at least one of the magnets to adjust the intensity of the primary magnetic field for such magnet. The first embodiment also includes a plurality of magnetic shields, one of the magnetic shields being arranged respectively between each of the spaced magnets.

In another embodiment, the plurality of magnets includes at least a first, second, and third magnet and the charged particle beam is an electron beam.

A further feature is that the first supporting coil is wound around the first magnet and a second supporting coil is wound around the third magnet.

Another object of the present invention is to have for each of the plurality of magnets a respective entry side and exit side for the beam. A first one of the plurality of magnetic shields is arranged between the first magnet and the second magnet. A second one of the shields is arranged between the second magnet and the third magnet. Finally, a third one of the shields is arranged at the entry side of the first magnet and the exit side of the third magnet.

It is another feature of the present invention that the magnetic shields absorb any leakage magnetic flux from the sides of the magnets.

In a preferred embodiment, the first magnet deflects the beam through a deflection angle of 50 degrees (±2 degrees). The entry side of the first magnet for the beam is perpendicular to the trajectory of the beam and its exit side is inclined −3 degrees (±2 degrees) to a plane perpendicular to the trajectory. The second magnet deflects the beam through a deflection angle of 158 degrees (±2 degrees). The entry side of the second magnet for the beam is perpendicular to the trajectory and its exit side is inclined −15 degrees (±2 degrees) to a plane perpendicular to the trajectory. Finally, the third magnet deflects the beam through a deflection angle of 62 degrees (±2 degrees). The entry and exit sides of the third magnet for the beam are each perpendicular to the trajectory.

In another embodiment of the present invention the first magnetic shield is also arranged at the exit side of the third magnet.

In a further embodiment, the distance between each of the magnetic shields and the sides of the closest respective magnets corresponds to the area where magnetic fields are generated.

It is also an object of the present invention to provide a method for deflecting a charged particle beam through an angle of substantailly 270°. The method comprises simultaneously generating a plurality of spaced primary magnetic fields between magnetic poles arranged along the desired trajectory of the beam. Each of the magnetic fields deflects a beam applied thereto through an angle less than 270°. The total angle through which the beam is deflected by the plurality of magnetic fields equals substantially 270°. Also included is generating a first secondary magnetic field for adjusting the intensity of at least one of the primary magnetic fields and absorbing any stray magnetic leakage flux that occurs between the spaced magnetic fields.

In a further feature of the method incorporating the principles of the present invention, a first secondary magnetic field is generated in conjunction with a first magnetic field and a second secondary magnetic field is generated in conjunction with a third magnetic field.

DESCRIPTION OF THE PREFERRED EMBODIMENTS

Figure 1B:
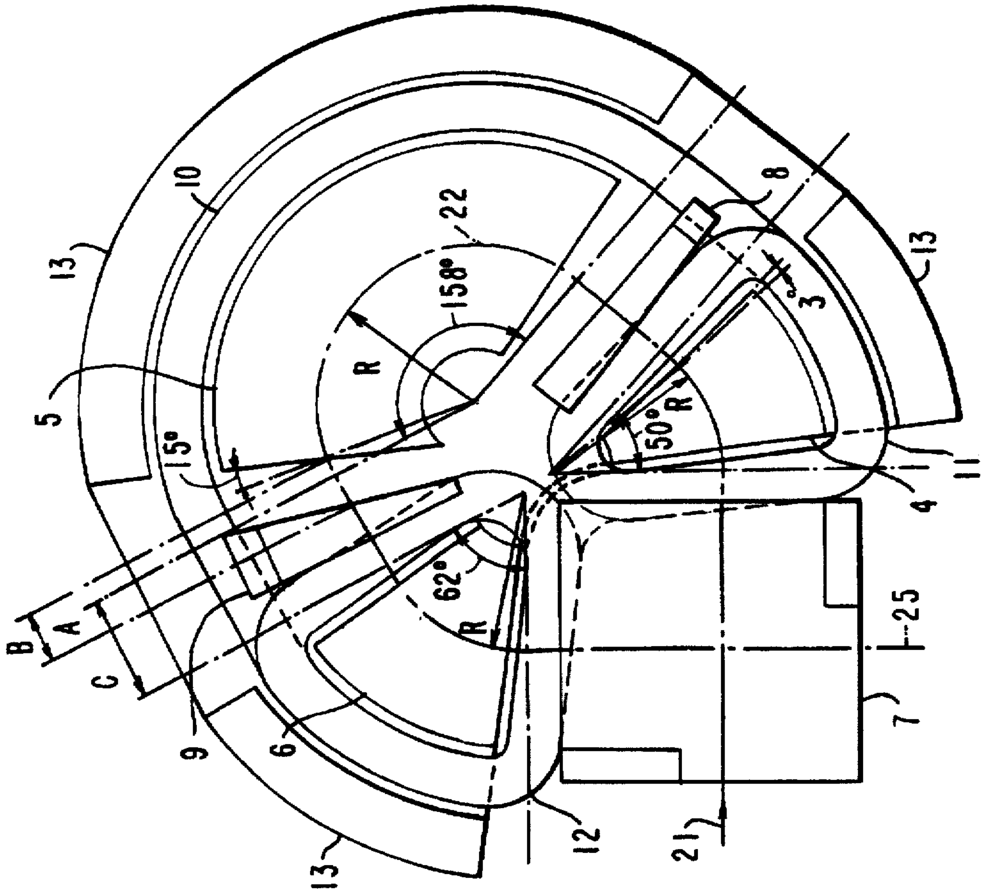
FIG. 1 includes FIG. 1(*a*) which is a side view of a magnetic deflection system according to a first embodiment of the present invention, and FIG. 1(*b*) which is a plan view of the first embodiment.
Figure 1A:
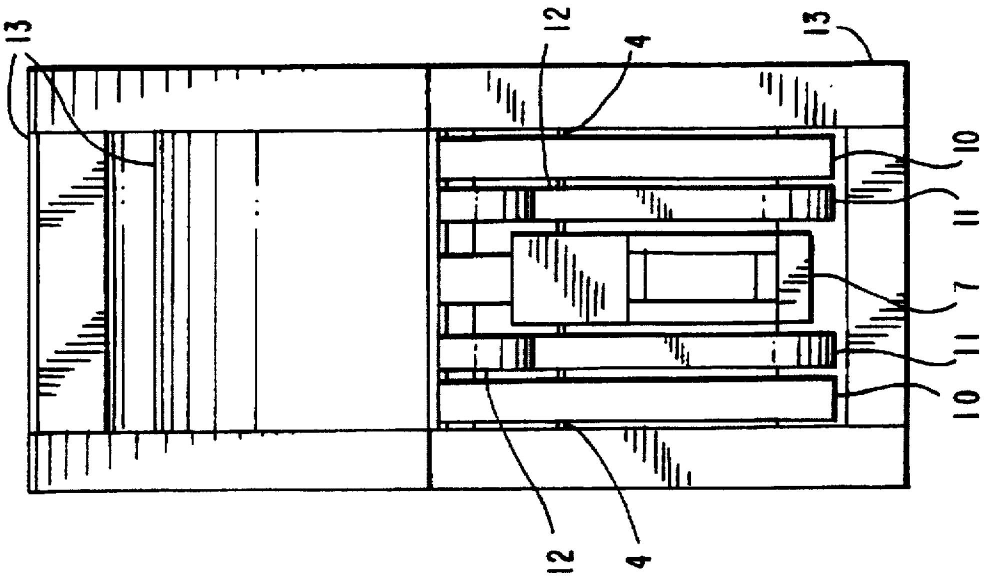

The details of this invention are described herein referring to the drawings. As noted above, FIG. 1 shows the configuration of the deflection magnet of this embodiment. FIG. 1(*a*) is a side view of a deflection magnet showing where an electron beam enters the magnetic field of the magnet; FIG. 1(*b*) is a plan view of the magnetic structure from a position which is perpendicular to the orbit of the electron beam, having a central orbit, as it passes through and is deflected by the magnetic field of the magnet.

As illustrated in FIG. 1, the deflection magnet of this embodiment is divided into three spaced sectors or magnets consisting of the first magnet 4, the second magnet 5, and the third magnet 6. In this embodiment, the deflection angles are set such that the deflection angle of the first magnet 4 is about 50 degrees (±2 degrees); the deflection angle of the second magnet 5 is about 158 degrees (±2 degrees); and the deflection angle of the third magnet 6 is about 62 (±2 degrees), so that the total deflection angle of the three spaced magnets is 270 degrees. The deflection angle of each magnet is determined according to the mutual deflection angles. Preferably, the deflection angle for the first magnet 4 is 50 degrees; the deflection angle for the second magnet 5 is 158 degrees; and the deflection angle for the third magnet 6 is 62 degrees.

Also, the first magnet 4 and second magnet 5 are arranged such that the surface angle of the exit side of the first magnet 4 for the electron beam is inclined about 3 degrees (±2 degrees) with respect to the central orbit or trajectory 22 of the electron beam. The surface angle of the exit side of the second magnet 5 for the electron beam is inclined about −15 degrees (±2 degrees) with respect to the central orbit or trajectory 22 of the electron beam. The exit angles of an electron beam from the first and second magnets are determined by mutual angles. The other end or entry side of each of these magnets are substantially perpendicular to the central orbit or trajectory 22 of the electron beam.

Note that "+" indicates the exit angle of an electron beam and suggests the existence of a lens effect in that the vector component of the electron beam in the direction of the magnetic field diverges, and in that the vector component which is perpendicular to the direction of the magnetic field converges. Also note that "−" indicates the existence of a lens effect in that the vector component of the electron beam in the direction of the magnetic field converges, and in that the vector component which is perpendicular to the direction of the magnetic field diverges.

In FIG. 1, the deflection angles for the first magnet 4, second magnet 5, and third magnet 6 are 50 degrees, 158 degrees, and 62 degrees, respectively. The surface angle of the exit side of the first magnet 4 for the electron beam is +3 degrees; the angle of the exit side of the second magnet 5 for the electron beam is −15 degrees. Also, the curvature radius R of the magnetic poles is the same for each of the magnets 4, 5, and 6, and the spacing between the respective magnets is the same as that of the orbit radius.

The vector component of the electron beam which is perpendicular to the magnetic field converges each time it passes through the magnetic field between the magnetic poles, diverges after focusing, and converges again to refocus.

In order to maintain the convergence effect at the magnet exit side, while making the vector components of the electron beam which are parallel to the direction of the magnetic field, the radius and the inclination of an electron beam equal, the magnets are spaced to form an area where there is no magnetic field. In addition, the lens effect is provided by inclining the end surfaces of the magnets to adjust the convergence and divergence cycles. Note that the sides of the magnets affect the vector component of the electron beam which is parallel to the direction of the magnetic field, which is already taken into account.

Figure 2:
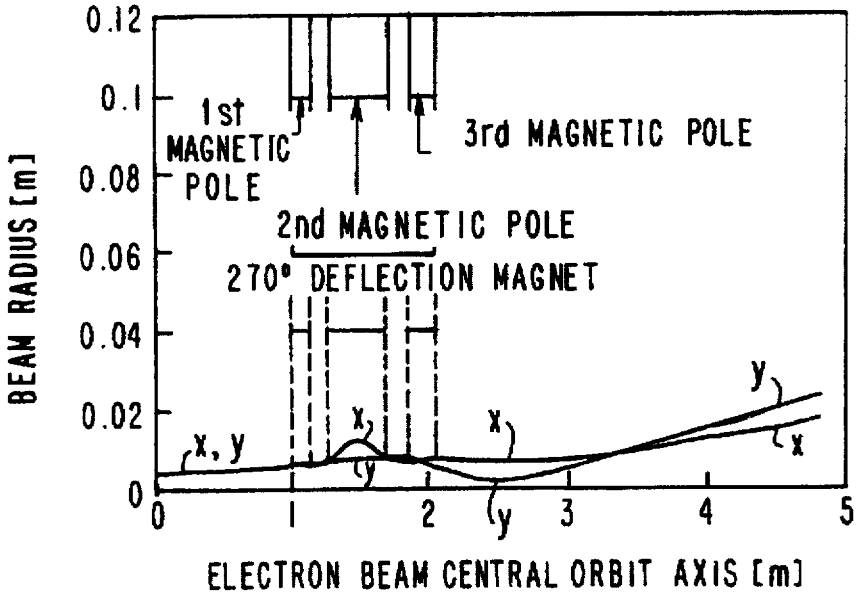
FIG. 2 is a graphical representation of the variation of the radius of an electron beam as it passes through the embodiment of FIG. 1.
Figure 4:
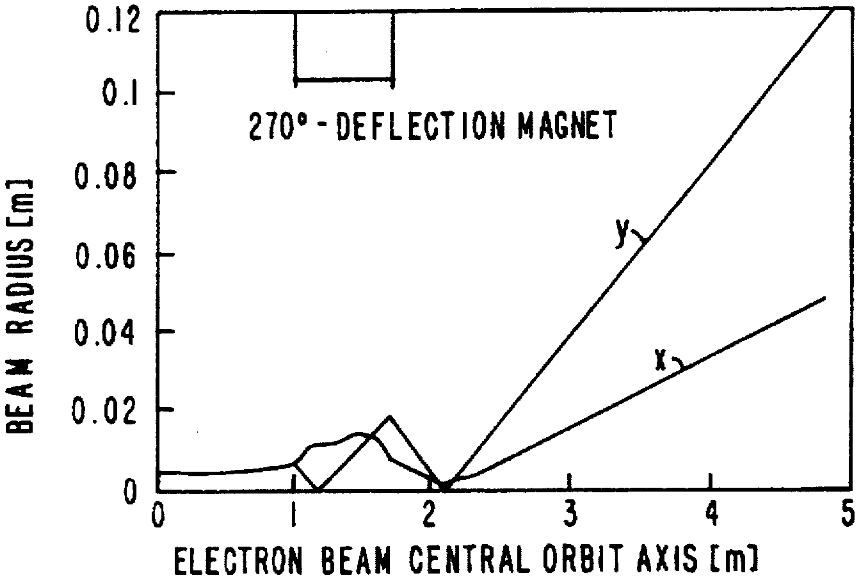
FIG.4 PRIOR ART
FIG. 4 is a graphical representation of the variation of the radius of an electron beam as it passes through the system of FIG. 3.
Figure 3:
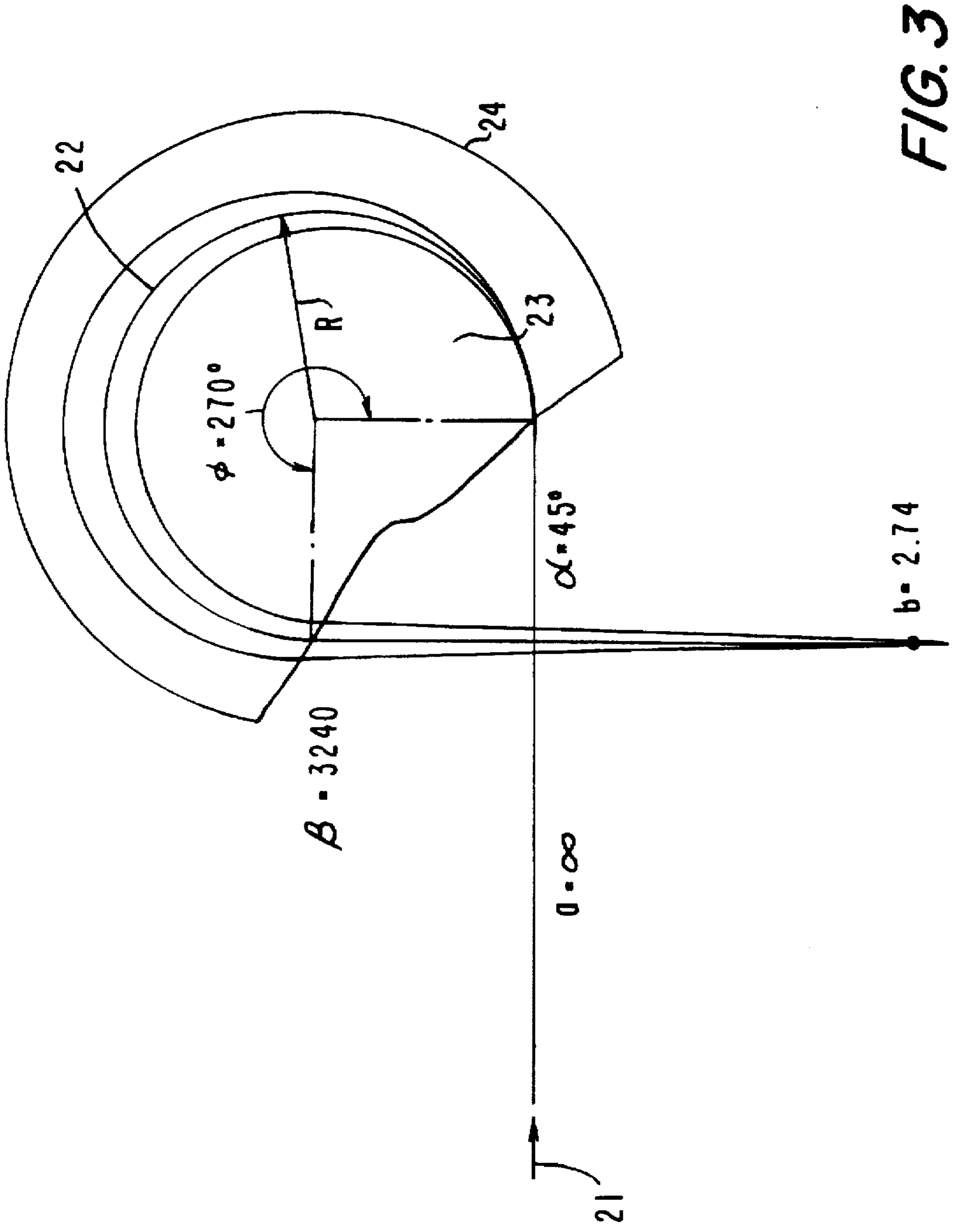
FIG. 3 PRIOR ART
FIG. 3 is a plan view of a conventional magnetic deflection system.

As illustrated in FIG. 2, with the deflection magnets arranged, as in FIG. 1, the almost circular cross-section of the electron beam is maintained until about 3 m away from the exit end of the deflection magnet.

In FIG. 1, a magnetic shield 7 is arranged at the entry side of the first magnet 4 for the electron beam and the exit side of the third magnet 6. The shield 7, accordingly, represents both the first and the fourth magnetic shields of the illustrated embodiment. A magnetic shield 8, the second magnetic shield, is arranged between the exit side of the first magnet 4 and the entry side of the second magnet 5. A magnetic shield 9, the third magnetic shield, is arranged between the exit side of the second magnet 5 and the entry side of the third magnet 6. The magnetic shields 7, 8, and 9 are arranged to reduce interference from any leakage magnetic flux coming from the sides of the magnets and to adjust any shifting of the central orbit or trajectory 22 of the electron beam.

The end surface of the exit side of the first magnet 4 next to the magnetic shield 8 arranged between the first magnet 4 and the second magnet 5 is inclined 3 degrees (±2 degrees). The end surface of the exit side of the second magnet 5 next to the magnetic shield 9 arranged between the second magnet 5 and the third magnet 6 is inclined −15 (±2 degrees). The inclined angle is determined by the surface angle of the exit side of the first magnet 4 and of the second magnet 5 for the electron beam. The other sides of the magnets are perpendicular to the central orbit or trajectory of the electron beam.

The respective distance between each of the magnets 4, 5, and 6, and each of the magnetic shields 7, 8, and 9, is set such that it satisfactorily reduces the magnitude of any leakage magnetic flux that exists at each of the magnetic shields 7, 8, and 9. If the magnetic shields 7, 8, and 9 are too close to the magnets, the magnitude of magnetic flux cannot be reduced satisfactorily. In this embodiment, the respective distance between the sides of the magnets and the magnetic shields 7, 8, and 9 is kept the same as that of the gap between the magnetic poles of the magnets.

A main coil 10 is arranged around the first magnet 4, the second magnet 5, and the third magnet 6. The main coil 10 generates equal primary magnetic fields at each of the magnets.

Supporting coils 11 and 12 are respectively wound around the first magnet 4 and the third magnet 6. The supporting coils 11 and 12 generate secondary magnetic fields to manipulate the magnetic fields at each magnet, respectively, to adjust the central orbit or trajectory of the electron beam. The supporting coils 11 and 12 adjust the intensity of the primary magnetic flux. For example, an adjustment in magnitude of 5% of the magnetic flux of the primary magnetic field generated by the main coil 10 is possible.

Next, the effects of the deflection magnet of this embodiment are described herein. To obtain a circular cross-section electron beam after being emitted from the deflection magnet, the vector component of the beam which is parallel to the direction of the magnetic field, the radius of the vector component of the beam which is perpendicular to the magnetic field, and the divergence angle need to be equal at the exit end of the entire deflection system, the exit side of the third magnet 6. The deflection magnet system of this embodiment adjusts the radius and the divergence angle for the vector components in both directions at the exit side of the third magnet 6 by means of dividing the system into three different spaced magnets comprising the first magnet 4, the second magnet 5, and the third magnet 6, and also by means of adjusting the angle of the exit sides of the magnets with respect to the central orbit or axis of the beam (for example, +3 degrees for the first magnet 4, and −15 degrees for the second magnet 5).

In other words, the vector component of an electron beam which is perpendicular to the direction of the magnetic field diverges as a result of the energy divergent effect, however, it also encounters the convergent effect at the same time. Therefore, a plurality of focuses exist within a magnetic deflection system. Dividing and spacing the magnets can move the focal point because there is no convergent effect between the spaced magnets. In addition, it is now possible to adjust the phase between the vector component which is parallel to the direction of the magnetic field and a focal point. Also, by inclining the exit sides of the magnets with respect to the central orbit of the electron beam, a lens effect is produced. Thus, the beam radius and the divergence angle can be controlled at the exit side of the magnet.

Also, the vector component which is parallel to the direction of the magnetic field is not influenced by the energy divergence and convergence effects of the magnetic field, but is influenced by the lens effect produced by the inclined exit sides of the magnets. This lens effect works inversely to the vector component which is perpendicular to the direction of the magnetic field.

To keep the circular cross-section of the electron beam after it has exited from the deflection magnet and to reduce the dispersion of the electron beam, the surface angle of the exit side of the first magnet 4 and the distance between the first magnet 4 and the second magnet 5 are adjusted so that the vector component which is parallel to the magnetic field is diverged and the vector component which is perpendicular to the magnetic field is converged within the magnet near the exit side of the second magnet 5. Also, the surface angle of the exit of the second magnet 5 is adjusted so that the vector component which is parallel to the magnetic field is converged, while the vector component which is perpendicular to the magnetic field is diverged. In addition, the vector component which is perpendicular to the magnetic field is converged at the exit side of the third magnet 6 to finally produce an electron beam which is substantially circular in cross-section.

The magnetic shields 7, 8, and 9, located respectively between each of the spaced magnets 4, 5, and 6, and at the entry side of the first magnet 4 and the exit side of the third magnet 6 are arranged to reduce the effects due to leakage magnetic flux from the sides of the magnets and to adjust any shift in the central orbit of the electron beam.

The leakage magnetic flux existing between the sides of the magnets 4, 5, and 6, and the magnetic shields 7, 8, and 9, which affects the central orbit of the electron beam, can be calculated based on the desired central orbit or trajectory of the electron beam. The side of the magnets can then be adjusted with respect to the actual deflection angles, so that the position derived from one-half of the calculated value is in agreement with the deflection angle for each of the magnets. The central angle of the magnet having a fan shape is smaller than the deflection angle of each of the magnets.

FIG. 1(*b*) shows the position A indicating the point at which the calculated value of the leakage magnetic flux density existing between the exit side of the second magnet 5 becomes one-half of the calculated value measured for the distance between the exit side of the second magnet 5 to the magnetic shield 9. FIG. 1(*b*) also shows the position B indicating the distance between the magnetic shield 9 and the exit side of the second magnet 5, measured along the central orbit 22 of the electron beam.

Also, between the first magnet 4 and the second magnet 5, the linear length of the electron beam is set to be equal to the curvature radius R of the central orbit of the electron beam in this embodiment. In FIG. 1(*b*), the linear length of the electron beam between the second magnet 5 and the third magnet 6 is marked as C.

The main coil 10 is arranged to surround the first magnet 4, the second magnet 5, and the third magnet 6 to provide the same driving force to these magnets which are divided into three spaced segments. In addition, each of the magnets 4, 5, and 6, share a common yoke 13. As a result, the leakage magnetic flux between each of the magnets increases. However, by installing the magnetic shields 7, 8, and 9, the leakage flux is absorbed, thus providing an ideal magnetic flux distribution.

The supporting coil 11 for the first magnet 4 and the supporting coil 12 for the third magnet 6 adjust large displacements which the magnetic shields 7, 8, and 9 may not be able to overcome by generating a secondary magnetic field which fine tunes the magnitude of the primary magnetic field between each of the magnetic poles of the magnets 4, 5, and 6. The supporting coils 11 and 12 may adjust the primary magnetic flux density generated by the main coil 10 in the second magnet 5 by 5%, for example.

FIG. 2 shows the result of the appropriate calculation for providing a desired electron beam orbit radius for the 270-degree deflection magnet of this embodiment. The selected central energy of the electron beam is 10 MeV; the energy range of the electron beam is ±1 MeV; and the initial divergence of the electron beam is 10 mrad.

As illustrated in FIG. 2, for the electron beam entering the magnetic field provided by the first magnet 4, the vector component x which is perpendicular to the magnetic field direction decreases due to the convergence force. However, the vector component y which is parallel to the magnetic field direction is not affected by this convergence force. This increases the beam cross-section radius by the initial divergence angle range.

At the exit side of the first magnet 4, the surface of the magnet is inclined by +3 degrees so that the x component converges while the y component diverges. Since there is no magnetic field between the first magnet 4 and the second magnet 5, the electron beam is not affected by any magnetic field in this area. However, the x component begins to diverge upon focusing. That is, the x component has a larger focal diameter at the first magnet 4 because of the energy range that exists in the electron beam.

Within the magnetic field produced by the second magnet 5, the x component changes from a divergence to a convergence action when the convergence force is in effect. The y component is not affected and the electron beam cross-section continues to expand. At the exit side of the second magnet 5 where the x component is inclined −15 degrees, the x component is affected by the divergence force, while the y component is affected by the convergence force.

In the magnetic field produced by the third magnet 6, only the x component is affected by the convergence force, while the y component is not affected at all and is emitted from the magnetic deflection system.

The cross-section of the electron beam, after passing through the magnetic deflection system, is substantially circular in shape at the point it is emitted. The divergence angle for the beam is kept low. The beam cross-section is substantially a circle until it travels 3 m upon emittance from the magnetic deflection system.

As indicated above, in the magnetic deflection system illustrated in FIG. 1, a common magnetic shield 7 is provided for both the entry side of the first magnet 4 and the exit side of the third magnet 6 for the electron beam. However, a separate magnetic shield can be provided for the entry side of the first magnet 4 and for the exit side of the third magnet 6, if desired.

As described above, in accordance with the principles of the present invention, three spaced magnetic fields are formed and the angle of the exit side of a magnet is inclined with respect to the center orbit of the electron beam by a predetermined angle so that the resulting lens effect helps to center the electron beam, and the leakage magnetic flux existing between the sides of the magnet is absorbed by a magnetic shield formed between each of the spaced magnets.

Various modifications will become possible for those skilled in the art after receiving the teachings of the present disclosure without departing from the scope thereof. For example, the illustrative embodiments of the present invention utilize electron beams. It is clear, however, that charged particles other than electrons may be used following the principles of the present invention. Therefore, the scope of the present invention is intended to be limited only by the appended claims.

What is claimed is:

1. A magnetic beam deflection system for deflecting a charged particle beam through an angle of substantially 270°, said system comprising:

three spaced magnets for respectively generating spaced magnetic fields arranged along a trajectory of the charged particle beam, each of said magnetic fields deflecting the charged particle beam through an angle less than 270°, the total angle of said charged particle beam deflected by said magnetic fields is equal to substantially 270°;

a main coil arranged around all of said magnets for simultaneously generating primary magnetic fields in said magnets;

a first supporting coil arranged around at least one of said magnets to adjust the intensity of said primary magnetic field in said one magnet; and a plurality of magnetic shields, one of said magnetic shields being arranged respectively between adjacent said spaced magnets.

2. A system, as claimed in claim 1, wherein said three spaced magnets includes first, second, and third magnets and said charged particle beam is an electron beam.

3. A system, as claimed in claim 2, wherein said first supporting coil is wound around said first magnet and a second supporting coil is wound around said third magnet.

4. A system, as claimed in claim 2, wherein each of said magnets has an entry side and an exit side for passing said electron beam therethrough and a first one of said plurality of magnetic shields is arranged between said first magnet and said second magnet, a second one of said shields is arranged between said second magnet and said third magnet, and a third one of said shields is arranged at said entry side of said first magnet and said exit side of said third magnet.

5. A system, as claimed in claim 4, wherein said magnetic shields absorb any leakage magnetic flux from said sides of said magnets.

6. A system, as claimed in claim 2, wherein said first magnet deflects said electron beam through a deflection angle of substantially 50 degrees, said first magnet having an entry side which is perpendicular to the trajectory of said electron beam and an exit side which is inclined substantially −3 degrees to a plane perpendicular to said trajectory;

said second magnet deflects said electron beam through a deflection angle of substantially 158 degrees, said second magnet having an entry side which is perpendicular to said trajectory and an exit side which is inclined substantially −15 degrees to a plane perpendicular to said trajectory; and said third magnet deflects said electron beam through a deflection angle of substantially 62 degrees, said third magnet having entry and exit sides which are each perpendicular to said trajectory.

7. A system, as claimed in claim 6, wherein a first magnetic shield is arranged at said entry side of said first magnet, said first magnetic shield having end portions perpendicular to said trajectory of said electron beam;

a second magnetic shield is arranged between said exit side of said first magnet and said entry side of said second magnet; and a third magnetic shield is arranged between said exit side of said second magnet and said entry side of said third magnet.

8. A system, as claimed in claim 7, wherein said first magnetic shield is also arranged at said exit side of said third magnet.

9. A system, as claimed in claim 7, wherein the distance between each of said magnetic shields and said sides of the closest respective magnets corresponds to the area where said magnetic fields are generated.

10. A method for deflecting a charged particle beam through an angle of substantially 270°, said method comprising the steps of:

simultaneously generating three spaced primary magnetic fields arranged along a trajectory of the charged particle beam, each of said primary magnetic fields deflecting said charged particle beam through an angle less than 270°, the total angle of said charged particle beam deflected by said primary magnetic fields is equal to substantially 270°;

generating a first secondary magnetic field for adjusting the intensity of at least one of said primary magnetic fields; and absorbing any stray leakage magnetic flux that occurs between said spaced primary magnetic fields.

11. A method, as claimed in claim 10, wherein said three spaced primary magnetic fields includes first, second, and third magnetic fields and said charged particle beam is an electron beam.

12. A method, as claimed in claim 11, wherein said first secondary magnetic field is generated in conjunction with said first magnetic field and further including the step of generating a second secondary magnetic field in conjunction with said third magnetic field.

* * * * *